United States Patent [19]

Palmer

[11] Patent Number: 4,646,028
[45] Date of Patent: Feb. 24, 1987

[54] GaAs MONOLITHIC MEDIUM POWER AMPLIFIER

[75] Inventor: Charles D. Palmer, Fairview, Tex.

[73] Assignee: Texas Instruments Incorporated, Dallas, Tex.

[21] Appl. No.: 644,410

[22] Filed: Aug. 27, 1984

[51] Int. Cl.[4] .............................................. H03F 3/16
[52] U.S. Cl. .................................. 330/277; 330/307; 330/286
[58] Field of Search .................. 330/277, 53, 286, 307

[56] References Cited

PUBLICATIONS

W. Vavken et al., "High Voltage Operation of Power GaAs FET Amplifier", Proceedings of the 10th European Microwave Conference, Warsaw, Poland, Sep. 8–12, 1980.
D. Hornbuckle, "A 2–6.2 GHz, 300 mW GaAs Mesfet Amplifier", Conference 1978 IEEE MTTS International Microwave Symposium, Ottawa, Can. Jun. 1978.

Primary Examiner—Gene Wan
Attorney, Agent, or Firm—Richard K. Robinson; Leo N. Heiting; Melvin Sharp

[57] ABSTRACT

A single-ended, bandpass, two stage monolithic (integrated) medium power amplifier is disclosed. The first stage of the amplifier includes a field effect transistor (FET) amplifier having a gate width of about 900 microns and the second stage a "split" field effect transistor (FET), i.e. two parallel connected FETs having gate widths of about 600 microns. The amplifiers of both stages have symmetrical biasing circuits providing the option of biasing the power amplifier from either side of the chip. The "split" (1200 micron) FET of the second stage decreases source inductance and reduces the thermal impedance.

6 Claims, 5 Drawing Figures

GaAs MONOLITHIC MEDIUM POWER AMPLIFIER

BACKGROUND OF THE INVENTION

This invention relates to amplifiers and more particularly to a microwave power amplifier.

In the past 6-18 GHz medium power amplifiers have been fabricated as hybrid type circuits. That is, the circuit elements such as, for example, the transistors, capacitors, and resistors have been discrete devices mounted on insulating substrates or metal carriers and interconnected with bonded wire leads.

The disadvantages of the prior art hybrid power amplifiers are cost and producibility. Highly skilled operators are required to assemble the hybrid amplifiers, and the manufacturing tolerances achievable with manual asembly methods result in significant performance variations between amplifiers. This necessitates that each circuit be tuned by a skilled test technician to meet the performance specifications.

The labor invested in each circuit results in an expensive product which cannot be produced in high volume quantities.

Accordingly, it is an object of this invention to provide a microwave power amplifier which is low in cost, easy to fabricate using mass production techniques and highly reliable.

Another object of the invention is to provide a substantially symmetrical circuit that can be easily used in a balanced amplifier configuration, allowing the option of applying bias supply voltages from either side of the chip.

Still another object of the invention is to provide a monolithic medium power amplifier, fabricated on a GaAs substrate.

SUMMARY OF THE INVENTION

Briefly stated, the medium power microwave amplifier constituting the subject matter of the invention comprises a single-ended, bandpass, two field effect transistor (FET), monolithic (integrated) medium power amplifier. To provide the option of applying bias supply voltages from either side of the chip, a symmetrical circuit is provided together with bandpass matching networks which enables the incorporation of integral bias networks. The amplifier is suitable for use in a balanced configuration.

Other objects and features of the invention will become more readily apparent from the following detailed description when read in conjunction with the accompanying drawings, in which:

DESCRIPTION OF THE PREFERRED EMBODIMENT

Figure 1:
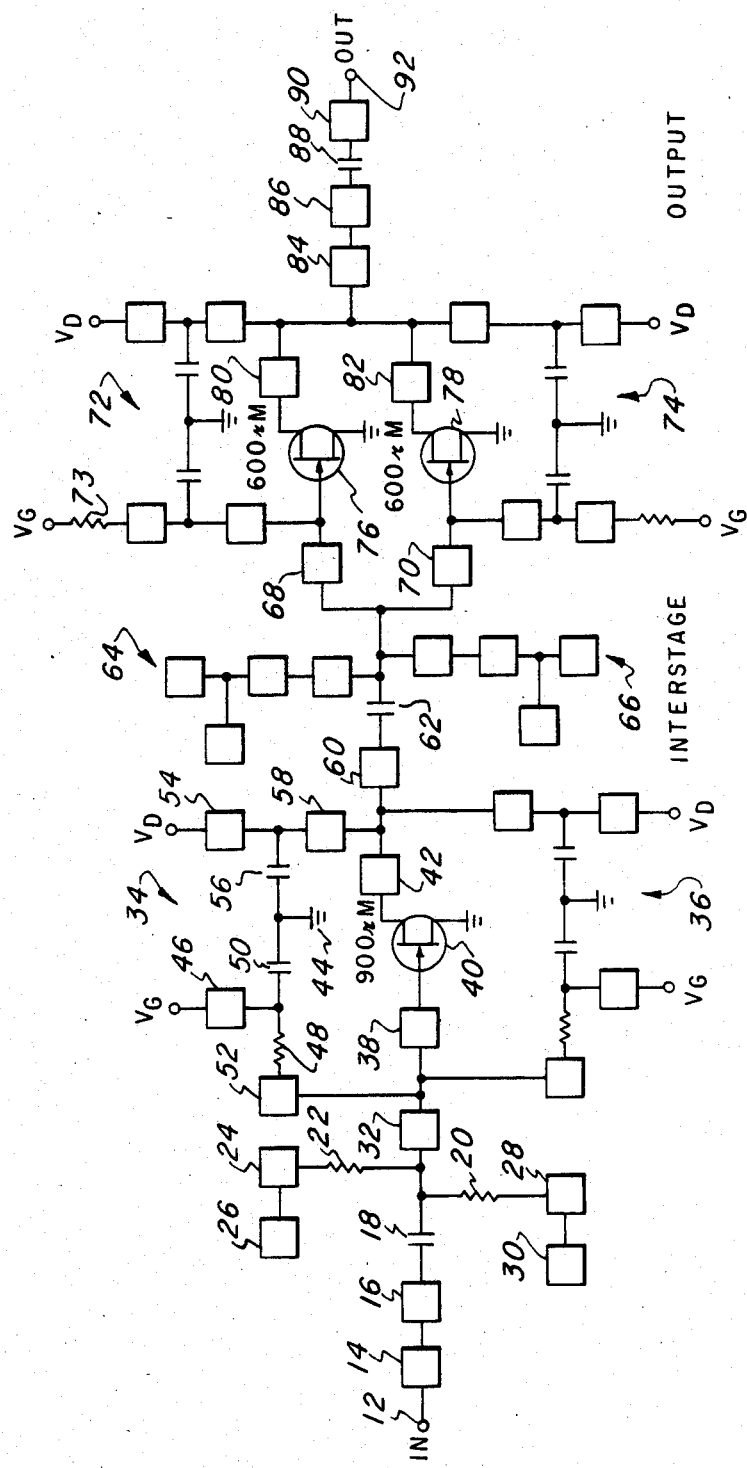
FIG. 1 is a schematic diagram of the medium power amplifier.

Referring now to FIG. 1, the medium power amplifier 10 includes an RF input 12 connected to 50 Ohm matching transmission lines 14 and 16. Transmission line 16 is connected to a dc blocking capacitor 18; capacitor 18 is connected to the junction of resistors 20 and 22 and transmission line 32. Resistors 20 and 22 are connected, respectively, to transmission lines 24, 26 28, and 30. The resistors 20,22 and transmission lines 24,26,28, and 30 compensate for gain peaking at the low end of the frequency band. Transmission line 32 is a matching line connected to the junction of bias circuits 34 and 36 and transmission line 38. Transmission line 38 is connected to the gate of FET 40. The source of FET 40 is connected to ground and its drain is connected through matching transmission line 42 to bias circuits 34 and 36.

Bias circuits 34 and 36 are identical (symmetrical) circuits; thus, only one (bias circuit 34) will be described. The bias circuit is divided by ground 44 into a $V_G$ and $V_D$ bias. The $V_G$ bias voltage is connected through transmission line 46 to the junction of resistor 48 and dc bypass capacitor 50. Resistor 48 is connected to matching transmission line 52. Transmission line 52 is connected to the junction of bias circuit 36, and transmission lines 32 and 38.

Transmission line 38, as previously stated, is connected to the gate of FET 40 and capacitor 50 is connected to ground 44. $V_D$ is connected through matching transmission line 54 to the junction of dc bypass capacitor 56 to ground 44 and matching transmission line 58. Transmission line 58 is connected to the junction of transmission line 42 to the drain of FET 40, bias circuit 36 and matching transmission line 60.

Transmission line 60 is connected through dc blocking capacitor 62 to the junction of interstage matching networks 64 and 66 and matching transmission lines 68 and 70. The matching transmission lines 68 and 70 are connected, respectively, to the junctions of bias circuits 72 and 74 and FET transistors 76 and 78. Except for a load resistor 73 connected to $V_g$, the biasing circuit topologies 72 and 74 are identical in structure to the above described biasing circuit topology 34. Thus biasing circuits 72 and 74 are not described in detail. Biasing circuits 34 and 36 and biasing circuits 72 and 74 being symmetrical and on opposite sides of the chip provide the option of supplying bias voltages to either side.

FETs 76 and 78 are connected, respectively, to impedance matching transmission lines 80 and 82. Transmission lines 80 and 82 are connected, respectively, through output matching transmission lines 84 and 86 and dc blocking capacitor 88 and transmission line 90 to output terminal 92.

It will be appreciated by those persons skilled in the art that the above described power amplifier is a two stage amplifier with the lower impedance matching transmission lines 42 through 70 forming the interstage matching network between FET 40 which forms the first stage of the amplifier and FETs 76 and 78 which form the second stage of the amplifier. FETs 76 and 78 are referred to as a "split" FET.

Figure 2:
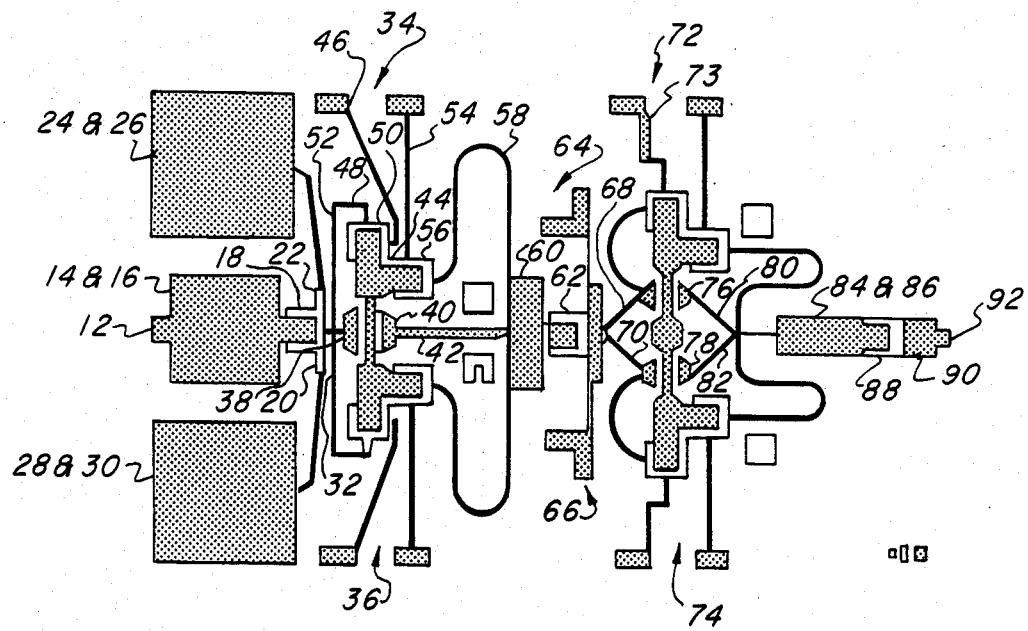
FIG. 2 is a plan view of the medium power amplifier in monolithic form.

Referring now to FIG. 2 in which the power amplifier is shown in monolithic form. In the first stage the FET 40 is, for example, a 900 micron gate width device and in the second stage the 1200 micron gate width FET comprises two parallel 600-micron gate width FETs 76 and 78. The "split" 1200-micron FET (FETs 76 & 78) decreases source inductance and reduces the channel temperature in the device. The elements of the circuit including the FETs 40, 76 and 78 are formed on a 0.10-millimeter thick GaAs semiconductor substrate. The 900-1200 micron amplifier is fabricated using either epitaxial or ion implanted material. In either case the substrate is a liquid encapsulated Czochralski (LEC) substrate. For epitaxial work, the substrate is etched and the $AsCl_3$ process is used to grow the buffer and active layers. The active layer is doped to approximately 1.5–1.8E17.

The first step in the process sequence is patterning and etching the active layer for device isolation. Next, the source-drain metallizaton and resistors are formed using alloyed AuGeNi, with a resistivity of approximately 1.9 ohms per $cm^2$. All levels except gate definition are formed using optical contact photolithography. The recessed TiPtAu gates are defined using E-beam lithography to yield a 0.5 micron gate length.

Following gate metallization, a first level metallization step forms the transmission lines and overlays for the device "bond pads." Then a 0.4-micron layer of silicon nitride is plasma deposited to form the capacitor dielectric and provide passivation. Fabrication of the top capacitor plates by metallization follows the nitride deposition. The capacitors are connected into the circuit using plate air-bridges.

The air-bridge/plating sequence consists of the following steps. A positive resist is applied and patterned to expose the nitride layer which is etched away. Then, a thin layer of gold is sputtered onto the slice, and another layer of resist is applied and patterned with the air-bridge mask. Finally, the transmission lines, bonding pads, capacitor top plates, as well as the air-bridges, are plated.

To complete the device the substrate is lapped to 0.1-millimeter, vias (holes) are formed using reactive-ion-etching and the backside metallized.

Figure 3A:
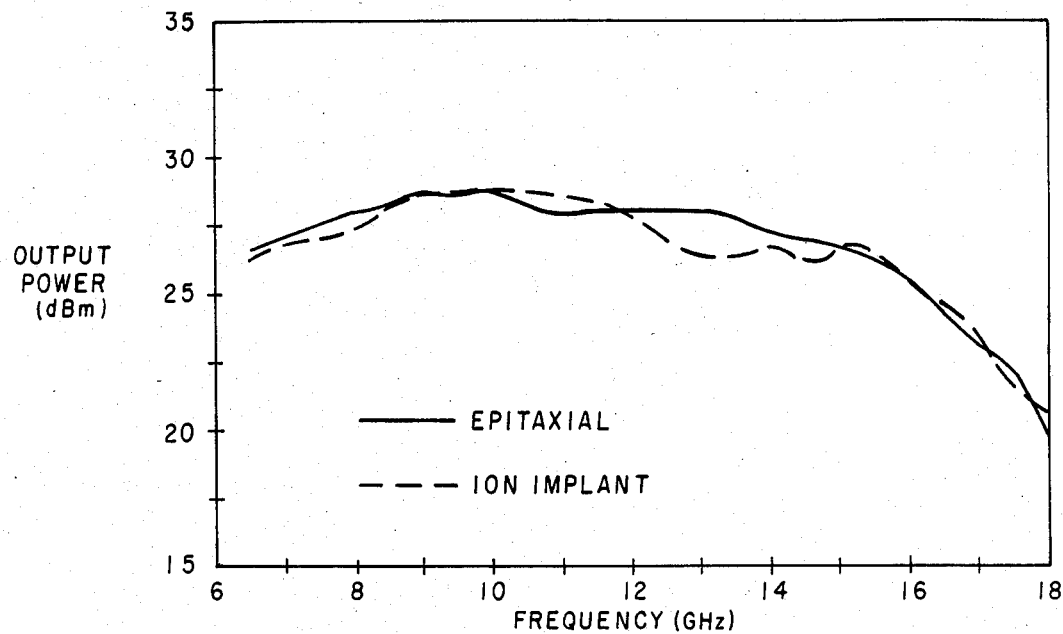
FIGS. 3a and 3b show the measured amplifier performance.
Figure 3B:
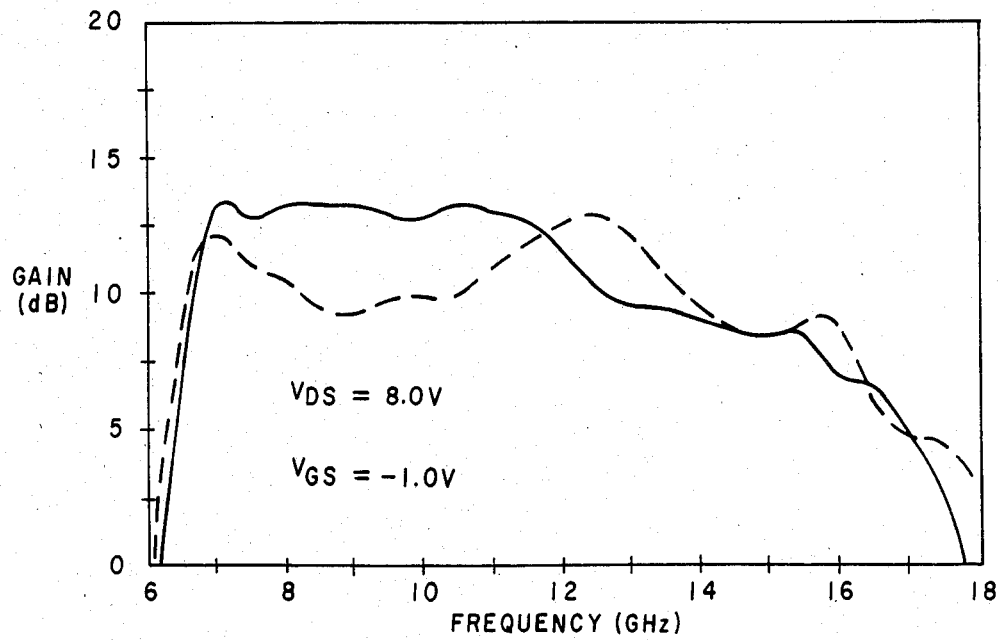

The microwave performance of the power amplifier is plotted in FIGS. 3a and 3b, showing the measured gain and output power at 1 dB gain compression. The epitaxial and ion implanted 900–1200 micron amplifiers average 27.4 dBm (550 mW) and 27.2 dBm (530 mW) across the band, respectively, which translates to 0.46 and 0.44 watts per millimeter of FET gate width. Under the same measurement conditions, average power-added efficiencies were 18.7 and 18.9 percent, with average gains of 11.0 and 10.2 dB, respectively.

Figure 4:
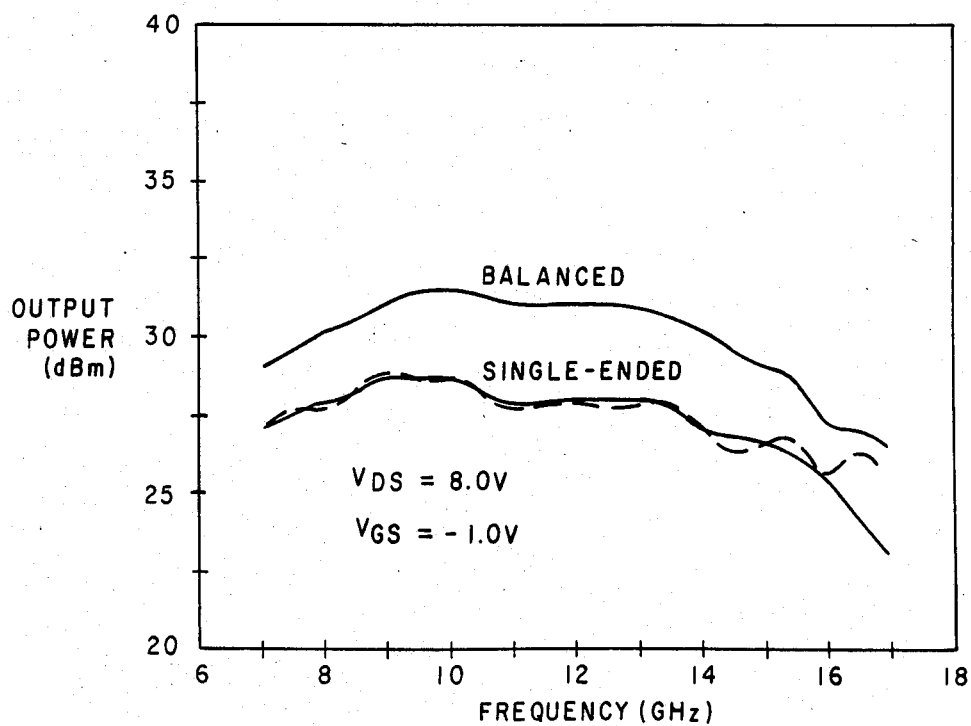
FIG. 4 shows the balanced amplifier performance at 1 dB gain compression.

The medium power amplifier is usable in a balanced configuration. FIG. 4. shows the combining efficiency achieved when balancing two chips from different slices. The chips were matched strictly from device I-V data, obtained prior to circuit assembly. The output power of each separate chip is shown, as well as the power obtained from the balanced pair. Across the 7.0–17.0 GHz frequency band, the balanced amplifier delivered an average of 30.1 dBm (1020 mW) at 1 dB gain compression. This represents an average combining efficiency of 2.5 dB.

Although only a single embodiment of the invention has been described, it will be apparent to a person skilled in the art that various modifications to the details of construction shown and described may be made without departing from the scope of the invention.

What is claimed is:

1. An improved microwave power amplifier comprising a GaAs substrate and an integrated circuit formed on the substrate, said integrated circuit containing:
   (a) an RF input terminal for receiving RF energy:
   (b) a load matching circuit means operatively connected to the RF input terminal for matching a load circuit impedance to that of the input terminal;
   (c) first and second biasing circuits each physically located on opposite sides of transistor amplifiers for selective connection to a biasing power source for biasing the transistor amplifiers from either side of the integrated circuit to a operating point:
   (d) a transistor operatively connected to the load matching means and first biasing circuits for forming a first stage amplifier:
   (e) interstage matching networks operatively connected to an output of the first stage transistor:
   (f) a transistor means operatively connected to the interstage networks and second biasing circuits for forming a second stage amplifier; and
   (g) an output impedance matching means operatively connected to the transistor means of the second stage amplifier.

2. An improved microwave power amplifier comprising a GaAs substrate, an integrated circuit formed on the substrate, said integrated circuit containing
   (a) an RF input terminal for receiving RF energy;
   (b) a load matching circuit means operatively connected to the RF input terminal for matching a load circuit impedance to that of the input terminal;
   (c) a compensation circuit means operatively connected to the load matching means for compensation of gain peaking at the low end of the frequency band;
   (d) first biasing circuits physically located on opposite sides of a transistor amplifier for selective connection to a biasing power source for biasing the transistor amplifier from either side of the integrated circuit to an operating point;
   (e) a transistor amplifier operatively connected to the load matching circuit means, compensation circuit means and biasing circuits for forming a first stage transistor amplifier;
   (f) interstage matching networks operatively connected to an output of the first stage transistor;
   (g) second biasing circuits physically located on opposite sides of a split transistor amplifier for selective connection to a biasing power source for biasing the split transistor amplifier from either side of the integrated circuit to an operating point;
   (h) said split transistor amplifier operatively connected to the interstage networks and second biasing circuits for forming a second stage split transistor amplifier; and
   (i) an output impedance matching means operatively connected to the second stage split transistor amplifier for output load matching.

3. An improved microwave power amplifier according to claim 2 wherein the split transistor of the second stage is a split field effect transistor for improved heat dissipation and to lower the source inductance for high frequency application.

4. An improved microwave power amplifier according to claim 2 wherein the transistor amplifier of the first amplifier stage comprises a field effect transistor (FET).

5. An improved microwave power amplifier according to claim 4 wherein the field effect transistor includes a gate having a width of about 900 microns.

6. An improved microwave power amplifier according to claim 3 wherein the split field effect transistor includes a pair of gates having widths of about 600 microns.

* * * * *